United States Patent
Lin

(10) Patent No.: US 9,852,967 B1
(45) Date of Patent: Dec. 26, 2017

(54) LEAD FRAME STRUCTURE FOR LIGHT EMITTING DIODE

(71) Applicant: ECOCERA Optronics Co., Ltd., Taoyuan (TW)

(72) Inventor: Yu-Jen Lin, Taoyuan (TW)

(73) Assignee: ECOCERA OPTRONICS CO., LTD., Taoyuan (TW)

( * ) Notice: Subject to any disclaimer, the term of this patent is extended or adjusted under 35 U.S.C. 154(b) by 0 days.

(21) Appl. No.: 15/584,387

(22) Filed: May 2, 2017

(51) Int. Cl.
  *H01L 23/495* (2006.01)
  *H01L 33/62* (2010.01)
  *H01L 33/54* (2010.01)

(52) U.S. Cl.
  CPC .. *H01L 23/49558* (2013.01); *H01L 23/49506* (2013.01); *H01L 23/49586* (2013.01); *H01L 33/54* (2013.01); *H01L 33/62* (2013.01); *H01L 2224/16253* (2013.01); *H01L 2224/16257* (2013.01); *H01L 2224/16258* (2013.01); *H01L 2224/32253* (2013.01); *H01L 2224/32257* (2013.01); *H01L 2224/32258* (2013.01)

(58) Field of Classification Search
  CPC ............ H01L 2224/32253–2224/32258; H01L 2224/16253–2224/16258; H01L 33/54
  USPC .................................................. 257/668, 667
  See application file for complete search history.

(56) References Cited

U.S. PATENT DOCUMENTS 7,834,375 B2 * 11/2010 Andrews ................. H01L 33/52
 257/100

\* cited by examiner

*Primary Examiner* — David Vu
*Assistant Examiner* — Brandon Fox
(74) *Attorney, Agent, or Firm* — Chun-Ming Shih; HDLS IPR Services

(57) ABSTRACT

A lead frame structure of a light emitting diode includes a ceramic bed, a metal layer and a plastic seat. The metal layer has a first metal circuit area, a second metal circuit area, a gap dividing the first metal circuit area and the second metal circuit area, and a metal ring surrounding the first metal circuit area, the second metal circuit area and the gap. The plastic seat has a hollow function area. The first metal circuit area, the second metal circuit area and a part of the metal ring expose the function area to make the metal (circuit) layer of the function area has no gap to avoid excess glue. This can efficiently accomplish to increase intensity, quality and reliability of the packaged products.

12 Claims, 4 Drawing Sheets

LEAD FRAME STRUCTURE FOR LIGHT EMITTING DIODE

BACKGROUND OF THE INVENTION

1. Technical Field

The invention relates to a lead frame structure, particularly to a lead frame for a light emitting diode using an annular gapless metal ring to avoid excess glue.

2. Related Art

Light emitting diodes (LEDs) possess advantages of long life, low power consumption, no warm-up time and quick response time. Thus applications of LEDs become more and more prevalent. In a manufacturing process of LEDs, a packaging process must be implemented after a die bonding process to protect an LED chip.

A conventional packaging process, as shown in FIG. 1, forms a metal circuit layer 20 on a ceramic bed 10, in which the metal circuit layer 20 uses at least one gap 30 to divide two electrodes 22, 24. A resin 50 is applied at openings of gaps 30 between electrodes 22, 24 to prevent excess glue. However, after sequent processes and resin has formed, excess glue still may occur in a function area of an LED. Because of the processing property of the resin 50, there may still be tiny slits in the resin 50 at the gap 30. Thus it cannot solve the problem of excess glue. As a result, the light emitted from an LED cannot be concentrated, the intensity is reduced and the process reliability is not good enough.

SUMMARY OF THE INVENTION

An object of the invention is to provide a lead frame structure for a light emitting diode, whose metal (circuit) layer of the function area does not contain any slit to prevent excess glue. This can efficiently increase intensity, quality and reliability of the packaged products.

To accomplish the above object, the lead frame structure of the invention includes a ceramic bed, a metal layer and a plastic seat. The ceramic bed has a first surface and a second surface corresponding thereto. The metal layer has a first metal circuit area, a second metal circuit area, a gap dividing the first metal circuit area and the second metal circuit area, and a metal ring surrounding the first metal circuit area, the second metal circuit area and the gap. The first metal circuit area, the second metal circuit area and the metal ring are formed on the first surface of the ceramic bed. The plastic seat is formed on the first surface and partially covers the metal ring. The plastic seat has a hollow function area. The first metal circuit area, the second metal circuit area and a part of the metal ring are exposed in the function area.

The invention also has other advantages. The metal layer of the invention is directly electroplated to form the first metal circuit area, the second metal circuit area and slitless or indentless metal ring. The metal layer of the invention uses a single process of electroplating, sputtering, vapor deposition or electroless plating to accomplish an effect of distinguishing positive and negative electrodes. This can efficiently simplify the manufacturing process and reduce the manufacturing cost. The metal ring can further prevent the gap of the function area from generating excess glue.

DETAILED DESCRIPTION OF THE INVENTION

Figure 1:
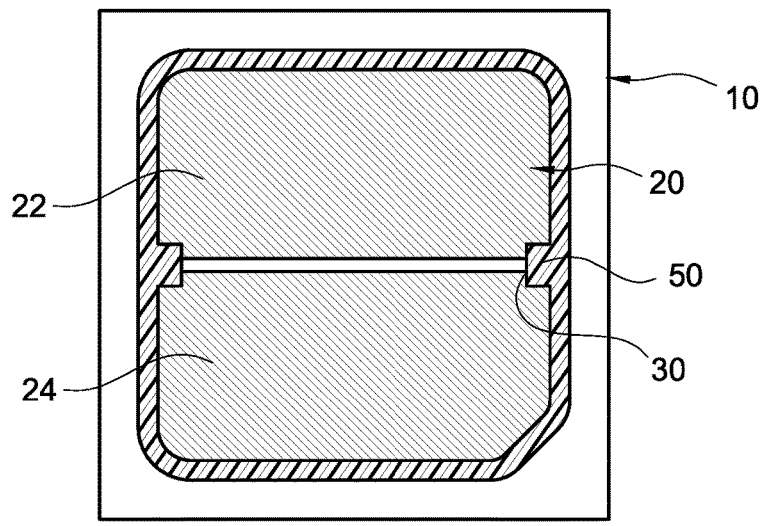
FIG. 1 is a schematic view showing excess glue formed between electrodes in a conventional LED lead frame.
Figure 2:
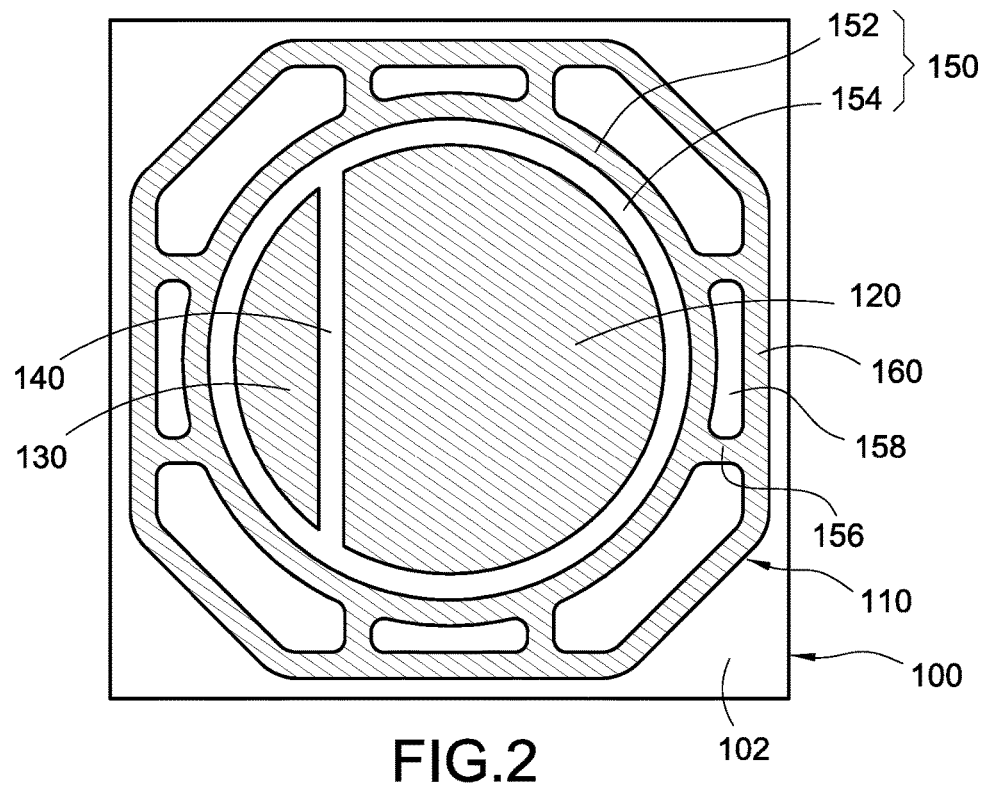
FIG. 2 is a plan view of the metal layer of the first embodiment of the invention.
Figure 3:
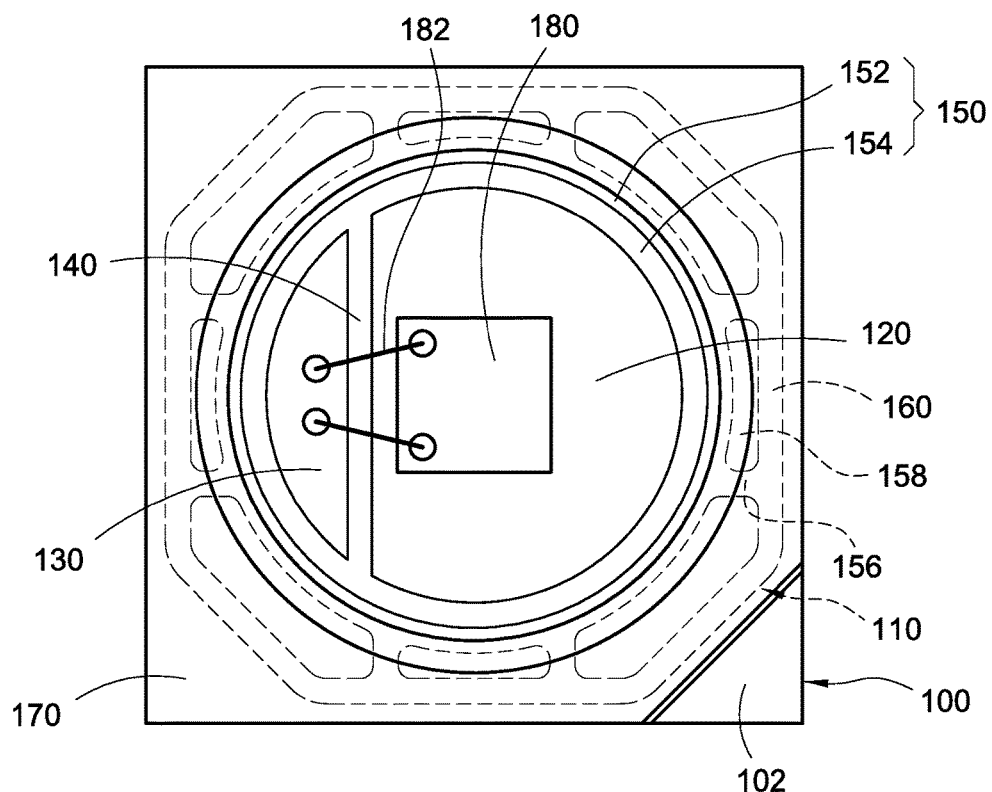
FIG. 3 is a schematic view of the first embodiment of the invention.
Figure 4:
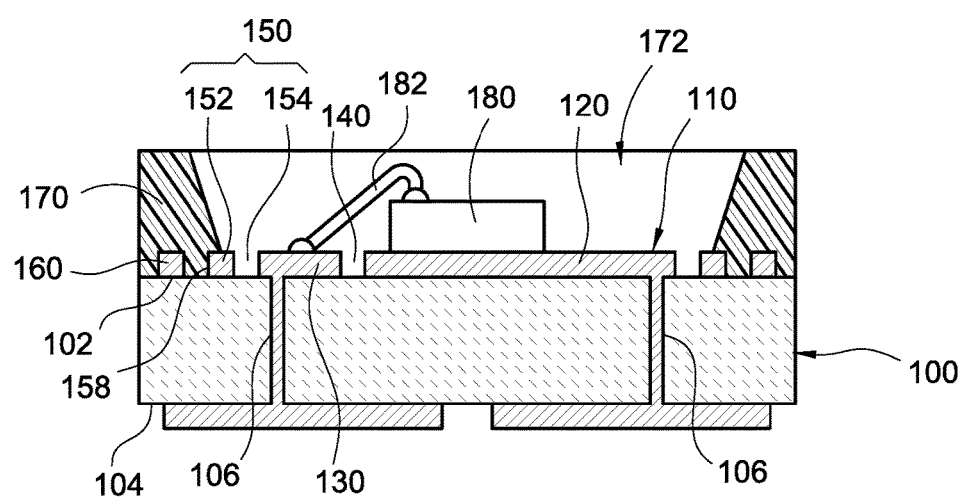
FIG. 4 is a cross-sectional view of the metal layer of the first embodiment of the invention.

Please refer to FIGS. 2-4, which show the first embodiment of the invention. As shown, the lead frame structure for an LED of the invention includes a ceramic bed 100, a metal layer 110 and a plastic seat 170. The ceramic bed 100 has a first surface 102 and a second surface 104 corresponding to the first surface 102. The metal layer 110 includes a first metal circuit area 120, a second metal circuit area 130, a gap 140 which divides the first metal circuit area 120 and the second metal circuit area 130, and a metal ring 150 which gaplessly surrounds the first metal circuit area 120, the second metal circuit area 130 and the gap 140. The first metal circuit area 120, the second metal circuit area 130 and the metal ring 150 are separately formed on the first surface 102 of the ceramic bed 100.

The metal layer 110 is directly formed on the first surface 102 of the ceramic bed 100 by an electroplating, sputtering, vapor deposition or electroless plating process. The preferable material for the metal layer 10 is gold, copper, silver, aluminum or their alloy with great conductivity. As shown in FIG. 4, the ceramic bed 100 is further provided with two through holes 106 which penetrate through the first and second surfaces 102, 104 and are located apart. When the metal layer 110 is formed on the ceramic bed 100, the first and second metal circuit areas 120, 130 will separately fill corresponding through holes 106 and form on the second surface 104 to provide the first and second surfaces 102, 104 of the ceramic bed 100 electric conduction.

When the first and second metal circuit areas 120, 130 are formed on the first and second surfaces 102, 104 of the ceramic bed 100, the gap 140 will divide the first and second metal circuit areas 120, 130 to distinguish positive and negative electrodes. When the first and second metal circuit areas 120, 130 separately penetrate corresponding through holes 106 to form on the second surface 104, the first and second metal circuit areas 120, 130 still stay separate without connection.

In this embodiment, because the metal layer 110 is formed by an electroplating, sputtering, vapor deposition or electroless plating process, the first and second metal circuit areas 120, 130 and the metal ring 150 separately protrude from the first surface 102. The first and second metal circuit areas 120, 130 and the metal ring 150 are the same in height. Their heights are flush with each other, so the structure and manufacturing process of the lead frame of the invention can be simplified, and the manufacturing cost can be reduced.

In this embodiment, the metal ring 150 further includes an inner metal ring 152 and an annular interval 154 dividing the inner metal ring 152, the gap 140, and the first and second metal circuit areas 120, 130. The inner ring 152 can obstruct excess glue during manufacturing the plastic seat 170, this will be described below. This embodiment further includes an outer metal ring 160 and ribs 156 connecting the outer metal ring 160 and the inner metal ring 152. The ribs 156 can enhance strength of the outer metal ring 160 and connectivity between the outer metal ring 160 and the plastic seat 170 to prevent the outer metal ring 160 and the inner metal ring 152 from separating during sequent etching process.

As shown in FIGS. 2 and 3, the outer metal ring 160 is approximately identical to the inner metal ring 152 in width, about 0.5-1.0 mm. The outer and inner metal rings 160, 152 are integratedly formed with the first and second metal circuit areas 120, 130. Additionally, a plurality of spaces 158 are formed in the outer and inner metal rings 160, 152, each of the ribs 156 separately passes one of the spaces 158 to connect the outer and inner metal rings 160, 152.

After the first and second metal circuit areas 120, 130 have been formed on the first and second surfaces 102, 104 of the ceramic bed 100 by an electroplating, sputtering, vapor deposition or electroless plating process, a die 180 bonding process and lead 182 bonding process will be performed. After that, a mold (not shown) is completely attached on and corresponds to the inner metal ring 152 in the function area 172 to make the plastic seat 170 by an injection molding process.

Because the metal ring 150 is gapless, when the metal ring 150 is being pressed on the function area 172, the protrudent inner metal ring 152 can prevent the liquid plastic seat 170 from infiltrating the gap 140 of the metal (circuit) layer 110. This can effectively overcome the problem of excess glue. As a result, excess glue can be avoided in the metal (circuit) layer 110 of the function area 172 to improve intensity (luminous efficiency), quality and reliability of the packaged products.

The embodiment shown in FIGS. 3 and 4 further includes a die 180 disposed in the first metal circuit area 120 and two leads 182 electrically connecting the die 180 and the second metal circuit area 130. In this embodiment, the first metal circuit 120 occupies a larger area to be mounted by the die 180, while the second metal circuit area 130 occupies a smaller area. The two leads 182 connect between the die 180/first metal circuit area 120 and the second metal circuit area 130 for electric conduction. As a result, the die 180 can be lit up by the power from the first and second metal circuit areas 120, 130. However, in other embodiments, the area and quantity of the first and second metal circuit areas 120 can be varied according to demand and design.

The plastic seat is formed on the first surface 102 and partially covers the metal ring 150 by an injection molding process. The plastic seat 170 has a hollow function area 172 with silicone or other available plastics to package it. The first metal circuit area 120, the second metal circuit area 130 and a part of the metal ring 150 are exposed in the function area 172.

Preferably, the plastic seat 170 is made of a polymer material such as high-density polyethylene (HDPE), low-density polyethylene (LDPE), polyethylene (PE), polypropylene (PP), polyethylene terephthalate (PET), polystyrene (PS), acrylonitrile butadiene styrene (ABS), polyvinyl chloride (PVC), polycarbonate (PC), ortho-phenyl phenol (OPP), oriented polystyrene (OPS), linear low-density polyethy (LLDPE), polyacetal (POM), polymerized siloxanes or polysiloxanes (also known as silicone). Any other available materials are optional.

Figure 5:
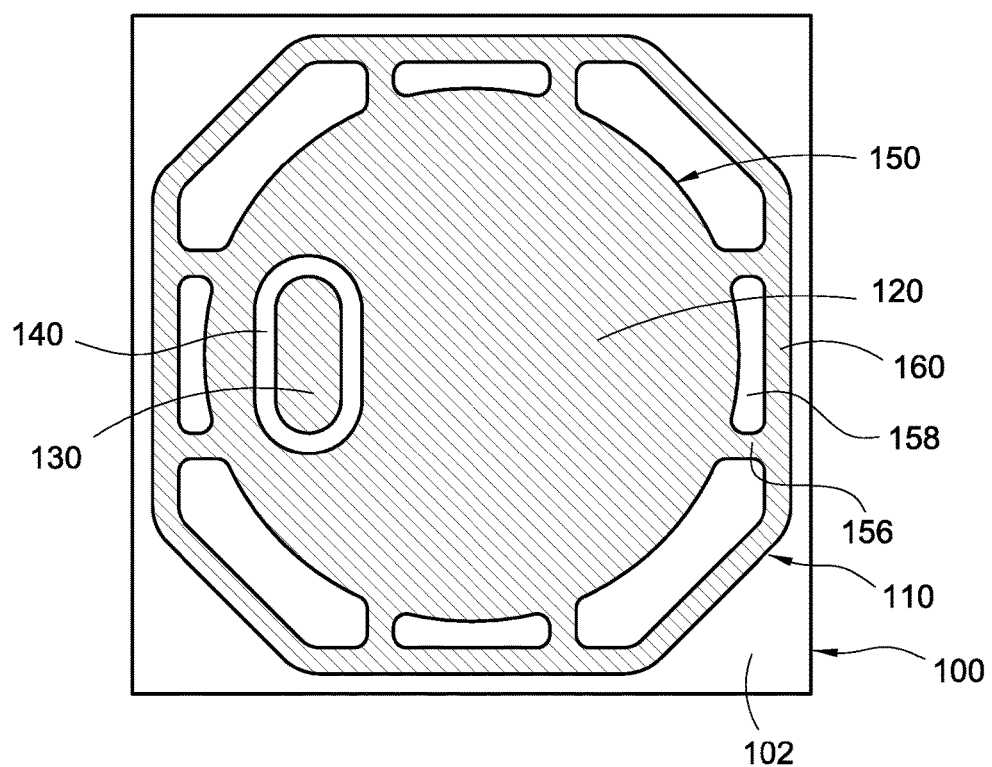
FIG. 5 is a plan view of the metal layer of the second embodiment of the invention.
Figure 6:
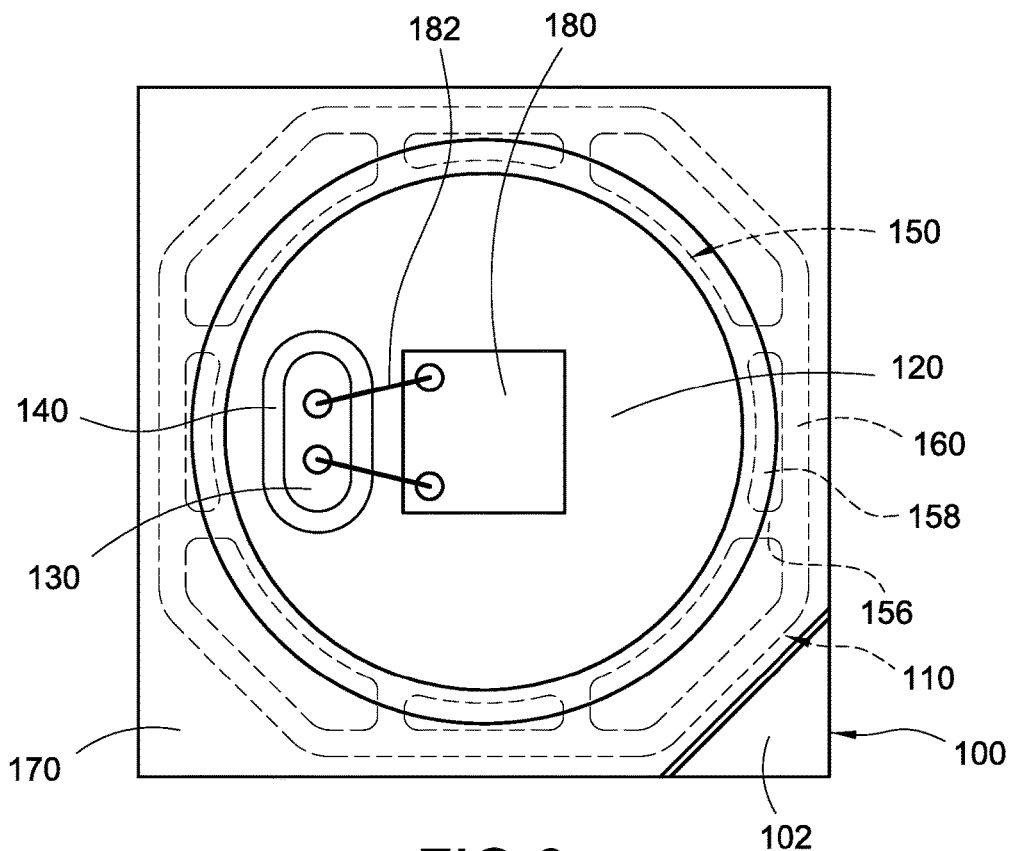
FIG. 6 is a schematic view of the metal layer of the second embodiment of the invention.
Figure 7:
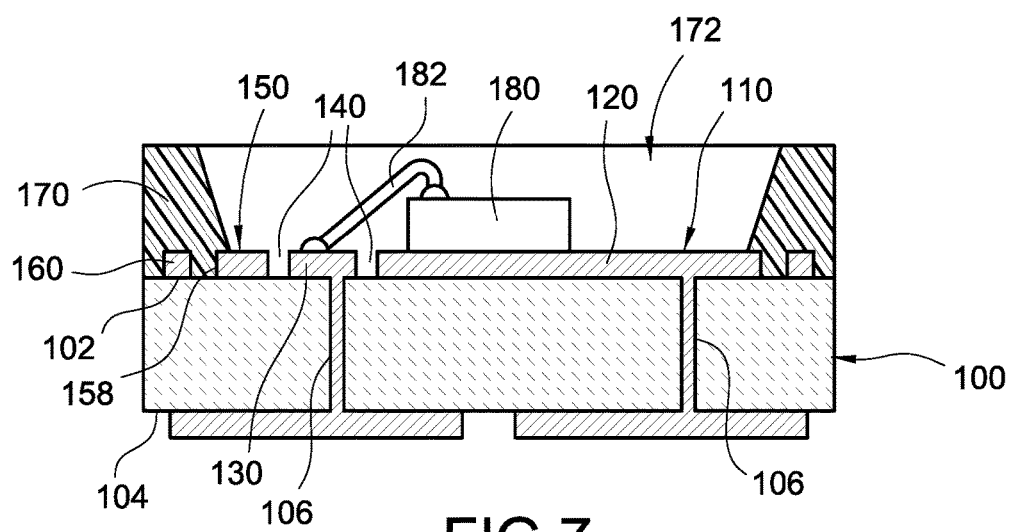
FIG. 7 is a cross-sectional view of the metal layer of the second embodiment of the invention.

Please refer to FIGS. 5-7, which show the second embodiment. As shown, this embodiment differs from the above embodiment in that the metal ring 150 is a periphery of the first metal circuit area 120. In other words, the metal ring 150 does not have an inner metal ring 152 and annular interval 154. The gap 140 dividing the first and second metal circuit area 120, 130 is preferably formed as a closed annularity. The rest are the same as the above embodiment.

The outer metal ring 160 is directly connected to the metal ring 150 by the ribs 156 so as to reinforce structural strength of the outer metal ring 160 and connecting strength between the outer metal ring 160 and the plastic seat 170. This can prevent the outer metal ring 160 and the metal ring 150 from separating. Additionally, a plurality of spaces 158 are formed in the outer metal ting 160 and the metal ring 150, and the ribs pass the spaces 158 to connect the outer metal ring 160 and the metal ring 150.

In the second embodiment, when the plastic seat 170 is being injection molded, it will be attached on the periphery (i.e., the metal ring 150) of the first metal circuit area 120 in the function area 172 by a mold. The protrudent and gapless metal ring 150 can prevent the liquid plastic seat 170 from infiltrating the gap 140 of the metal (circuit) layer 110. This can effectively overcome the problem of excess glue. As a result, excess glue can be avoided in the metal (circuit) layer 110 of the function area 172 to improve intensity (luminous efficiency), quality and reliability of the packaged products.

It is noted that the metal layer 110 is directly electroplated on the first and second metal circuit areas 120, 130 and the metal ring 150. The metal layer 110 of the invention uses a single process of electroplating, sputtering, vapor deposition or electroless plating to accomplish an effect of distinguishing positive and negative electrodes. This can efficiently simplify the manufacturing process and reduce the manufacturing cost. The metal ring 150 can further prevent the gap 140 of the function area 172 from generating excess glue.

It will be appreciated by persons skilled in the art that the above embodiments have been described by way of example only and not in any limitative sense, and that various alterations and modifications are possible without departure from the scope of the invention as defined by the appended claims.

What is claimed is:

1. A lead frame structure for a light emitting diode, comprising:
   a ceramic bed, having a first surface and a second surface corresponding thereto;
   a metal layer, having a first metal circuit area, a second metal circuit area, a gap dividing the first metal circuit area and the second metal circuit area, and a metal ring surrounding the first metal circuit area, the second metal circuit area and the gap, wherein the first metal circuit area, the second metal circuit area and the metal ring are formed on the first surface of the ceramic bed; and
   a plastic seat, formed on the first surface, partially covering the metal ring, having a hollow function area, wherein the first metal circuit area, the second metal circuit area and a part of the metal ring expose the function area.

2. The lead frame structure of claim 1, wherein the first and second metal circuit areas and the metal ring separately protrude from the first surface, and the first and second metal circuit areas and the metal ring are the same in height.

3. The lead frame structure of claim 1, wherein the metal ring further comprises an inner metal ring and an annular interval dividing the inner metal ring, the gap, and the first and second metal circuit areas.

4. The lead frame structure of claim 3, further comprising an outer metal ring and a plurality of ribs connecting the outer metal ring and the inner metal ring, wherein the outer metal ring is approximately identical to the inner metal ring in width.

5. The lead frame structure of claim 3, wherein the outer and inner metal rings are integratedly formed with the first and second metal circuit areas.

6. The lead frame structure of claim 4, wherein a plurality of spaces are formed in the outer and inner metal rings, and each of the ribs separately passes one of the spaces to connect the outer and inner metal rings.

7. The lead frame structure of claim 1, wherein the metal ring is a peripheral area of the first metal circuit area.

8. The lead frame structure of claim 7, further comprising an outer metal ring and a plurality of ribs connecting the outer metal ring and the metal ring, wherein the outer metal ring is integratedly formed with the first metal circuit area and the second metal circuit area.

9. The lead frame structure of claim 7, wherein a plurality of spaces are formed in the outer metal ring and the metal ring, and each of the ribs separately passes one of the spaces to connect the outer metal ring and the metal ring.

10. The lead frame structure of claim 1, further comprising a die disposed in the first metal circuit area and two leads electrically connecting the die and the second metal circuit area.

11. The lead frame structure of claim 1, wherein the ceramic bed is further provided with at least two through holes which penetrate through the first and second surfaces and are located apart, and the first and second metal circuit areas separately fill corresponding through holes and form on the second surface.

12. The lead frame structure of claim 1, wherein the plastic seat is made of a polymer material.

\* \* \* \* \*